United States Patent [19]

Finnegan

[11] 4,222,047
[45] Sep. 9, 1980

[54] LAMP FAILURE DETECTION APPARATUS

[76] Inventor: George E. Finnegan, 1712 N. Monitor, Chicago, Ill. 60639

[21] Appl. No.: 957,933

[22] Filed: Nov. 6, 1978

[51] Int. Cl.² ............................................. G08B 21/00
[52] U.S. Cl. .................................. 340/641; 340/642; 315/135; 315/136
[58] Field of Search ................ 340/46, 641, 642, 652; 315/120, 129, 130–133, 135, 136; 324/20 R, 21, 22, 23, 51

[56] References Cited

U.S. PATENT DOCUMENTS

| | | | |
|---|---|---|---|
| 3,026,448 | 3/1962 | Brown | 315/135 |
| 3,040,243 | 6/1962 | Weiss | 340/642 |
| 3,197,674 | 7/1965 | Hellman | 315/129 |
| 3,346,770 | 10/1967 | Stewart | 315/136 |
| 3,659,146 | 4/1972 | Munson | 315/136 |
| 3,706,983 | 12/1972 | Olson et al. | 340/642 |
| 3,745,547 | 7/1973 | Hapank | 315/130 |
| 3,797,003 | 3/1974 | Ramshaw | 340/641 |
| 3,883,777 | 5/1975 | Morita | 340/641 |
| 3,952,229 | 4/1976 | Rekow | 340/642 |
| 3,967,192 | 6/1976 | Kellogg et al. | 315/132 |

*Primary Examiner*—Gerald L. Brigance
*Attorney, Agent, or Firm*—McWilliams, Mann & Zummer

[57] ABSTRACT

A lamp failure detection arrangement includes a device for interrupting electrical energy to a lamp, and a testing device for generating a low level test signal and for supplying it during the testing interval to the lamp for test purposes without causing the lamp to provide illumination. A device responds to the test signal indicating a failure condition of the lamp for generating a failure condition signal, which can be used both to energize a standby lamp and to generate an attention-attracting signal for alerting an attendant to replace the faulty lamp.

11 Claims, 6 Drawing Figures

LAMP FAILURE DETECTION APPARATUS

The present invention relates in general to a lamp failure detection apparatus, and it more particularly relates to such an apparatus which can either be used upon detection of a failure of the lamp, to generate an attention-attracting signal for alerting an attendant to replace the faulty lamp, or for energizing a standby lamp.

Many different types and kinds of lighting control systems have been known in the past. For example, reference may be made to the following U.S. Pat. Nos. 1,132,008; 1,496,755; 1,805,764; 3,076,123; 3,197,674; 3,226,601; 3,611,432; 3,633,196; 3,671,955; 3,699,382; 3,719,937; 3,790,846; 3,801,975; 3,814,984; 3,819,980; 3,840,801; 3,852,733; 3,909,669; 3,952,229; and 4,019,128. The prior art patents include lamp failure detection circuits, some of which serve as fail-safe back-up lighting arrangements. In this regard, a standby lamp may be energized when a primary lamp fails. While the foregoing-mentioned circuits may be satisfactory for some applications, it would be highly desirable to have a lamp failure detection arrangement which can detect a failure of a lamp when it is being energized and even when it is not energized. Faulty conditions of a lamp include an open-circuited lamp, a damaged lamp or a lamp missing from its socket. In this regard, in some applications, it would be desirable to detect a faulty condition of a lamp, either a primary lamp or a standby lamp, so that the faulty lamp can be replaced and/or a standby lamp energized in the meantime, and such fault-detection can take place while the lamp is either turned on or off. Thus, such a circuit arrangement should be highly efficient in operation and relatively inexpensive to manufacture. Additionally, such a circuit arrangement should be adapted to be used in connection with a source of alternating current.

Therefore, the principal object of the present invention is to provide a new and improved lamp failure detection apparatus, which is able to test a lamp for faulty conditions, either while it is illuminated or while it is extinguished.

Another object of the present invention is to provide such a new and improved lamp failure detection apparatus which is relatively inexpensive to manufacture, and which is powered by a source of alternating current, so that the apparatus can be powered from conventional power lines without need for excessive and expensive installations of special power lines where widely disbursed stand-alone lighting systems, such as traffic signal lights, are involved.

Briefly, the above and further objects of the present invention are realized by providing a new and improved lamp failure detection apparatus, which includes a device for interrupting the electrical energy supplied to the lamp during a testing interval of time. A testing device generates a low level test signal and supplies it during the testing interval to the lamp for testing purposes without causing the lamp to provide illumination. Another device responds to the test signal indicating a failure condition of the lamp and generates a failure condition signal, which may be used to either indicate the failure condition to attendants or to energize a standby lamp.

The apparatus of the present invention can test both a primary lamp and a standby lamp. The lamp testing is an automatic self-testing operation and thus is not dependent on a human operator. The failure indication signal may be used to illuminate a neon lamp to provide a clear and unmistakable signal of the fault condition. Both the primary and standby lamps can have neon failure indicating lamps so that there is no mistake as to which lamp failed. The neon lamps are very reliable and not ordinarily subject to failures themselves. The electronic switching from the primary to the standby lamp upon failure of the primary lamp is performed rapidly to avoid interruption of service in an automatic manner without human intervention and without wear-susceptible moving parts, such as relays.

Other objects and features of the present invention will become apparent to those skilled in the art by a review of the following detailed description, taken in conjunction with the accompanying drawings, wherein:

Figure 1:
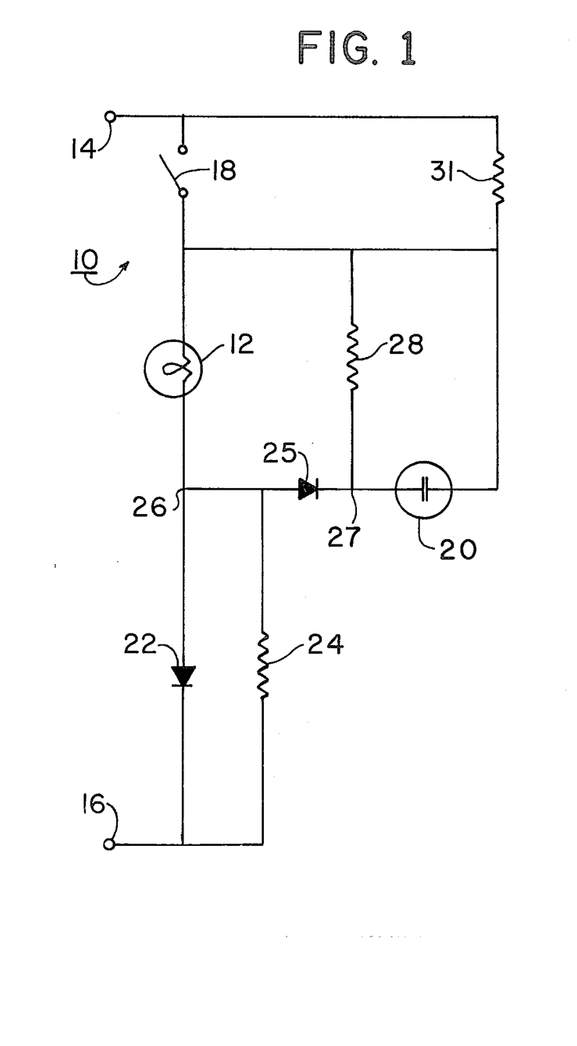
FIG. 1 is a schematic circuit diagram of a lamp detection apparatus, which is constructed in accordance with the present invention and which employs a single lamp.

Referring now to the drawings, and more particularly to FIG. 1 thereof, there is shown a lamp failure detection apparatus 10, which is constructed in accordance with the present invention and which detects faulty conditions of a lamp 12. The apparatus 10 includes a pair of input terminals 14 and 16 which are adapted to be connected to a conventional 120 V 60 cycle power line, the terminal 14 being the main terminal and the terminal 16 being the common terminal. A switch 18 is connected between the main terminal 14 and the lamp 12, whereby when the switch 18 is closed, the lamp 12 is energized as hereinafter described in greater detail. A neon failure indicating lamp 20 becomes energized and is illuminated when a faulty condition of the lamp 12 occurs and thus the lamp 12 is rendered effectively an open circuit. Such a faulty condition occurs when the lamp 12 is open-circuited, damaged or missing from its socket (not shown). It should be noted that in accordance with the present invention, the failure indicating lamp 20 is illuminated for indicating a faulty lamp 12 either when the switch 18 is opened or closed. Thus, as hereinafter described in greater detail, the circuit 10 is continuously testing the lamp 12 for a faulty condition, both during the time when the switch 18 is closed to illuminate the lamp 12 and when the lamp 12 is extinguished during the time when the switch 18 is opened. For example, should the lamp 12 become broken or otherwise malfunction during its off condition when the switch 18 is opened, the failure indicating lamp 20 becomes illuminated for attention-attracting purposes so that the lamp 12 can then be replaced by attendants.

When a faulty condition occurs, a lamp failure signal energizes the lamp 20. However, it will become apparent to those skilled in the art that the lamp failure signal may be used to operate other devices, such as any alarm device for generating a visible, audible or radiofrequency signal to warn of the faulty lamp condition.

The circuit 10 may be used in locations where security is needed. For example, the circuit 10 may be used in a message sign, such as an exit, emergency, fire alarm, restricted area or the like.

Considering now the circuit 10 in greater detail with reference to FIG. 1 of the drawings, a diode 22 is connected between the lamp 12 and the common terminal 16, the diode 22 being suitably poled to enable the lamp 12 to be energized during the positive half cycles of the input power through a circuit extending between the main terminal 14, the closed switch 18, the lamp 12, the diode 22 and then to the common terminal 16. Thus, the diode 22 serves to interrupt the power energizing the lamp 12 when the switch 18 is closed to provide a test interval during the negative half cycles of the input power.

For purposes of testing the lamp 12 during the negative half cycles of the input power, a diode 25 is connected between a junction 26 between the lamp 12 and the diode 22 and a junction 27 between the failure indicating lamp 20 and a circuit stabilizing resistor 28, the diode 25 being suitably poled to enable the neon lamp 20 to be illuminated should the lamp 12 be open-circuited as a result of a faulty condition, thereby providing a visible attention-attracting signal for attendants. In this regard, during the negative half cycles of the input power, current flows from the common terminal 16 through the resistor 24, the lamp 12 and the closed switch 18 to the main terminal 14. The resistor 24 limits the current flowing through the lamp 12 during the negative half cycles so as to test the lamp 12 for continuity without illuminating it. However, should the lamp 12 be open circuited as a result of a faulty condition, sufficient potential is developed across the neon lamp 20 to cause it to become illuminated. The neon lamp 20 is a longlife neon lamp which would be rated, for example, for 25,000 hours. Such a neon lamp does not fail abruptly, but gives a warning indication in the form of flickering action prior to its failure. Thus, such a lamp 20 provides the circuit 10 with a high degree of reliability.

A resistor 31 is connected in parallel with the switch 18 so that when the switch 18 is open, the lamp continues to be tested during negative half cycles of the input source. As a result, the circuit 10 functions to test the lamp 12 in a similar manner whether the switch 18 is opened or closed.

After a malfunction, a faulty lamp 12 is replaced and the lamp 20 becomes extinguished automatically.

Representative component values of an apparatus of the present invention are as follows:

| Element | Value |
| --- | --- |
| lamp 12 | 60 watts, 85 volts |
| failure indicating lamp 20 | Ne 2H |
| diode 22 | 200 volts, 1 amp. |
| resistor 24 | 39K |
| diode 25 | 200 volts, 0.1 amp. |
| resistor 28 | 1.5 Meg |
| resistor 31 | 39K |

Figure 2:
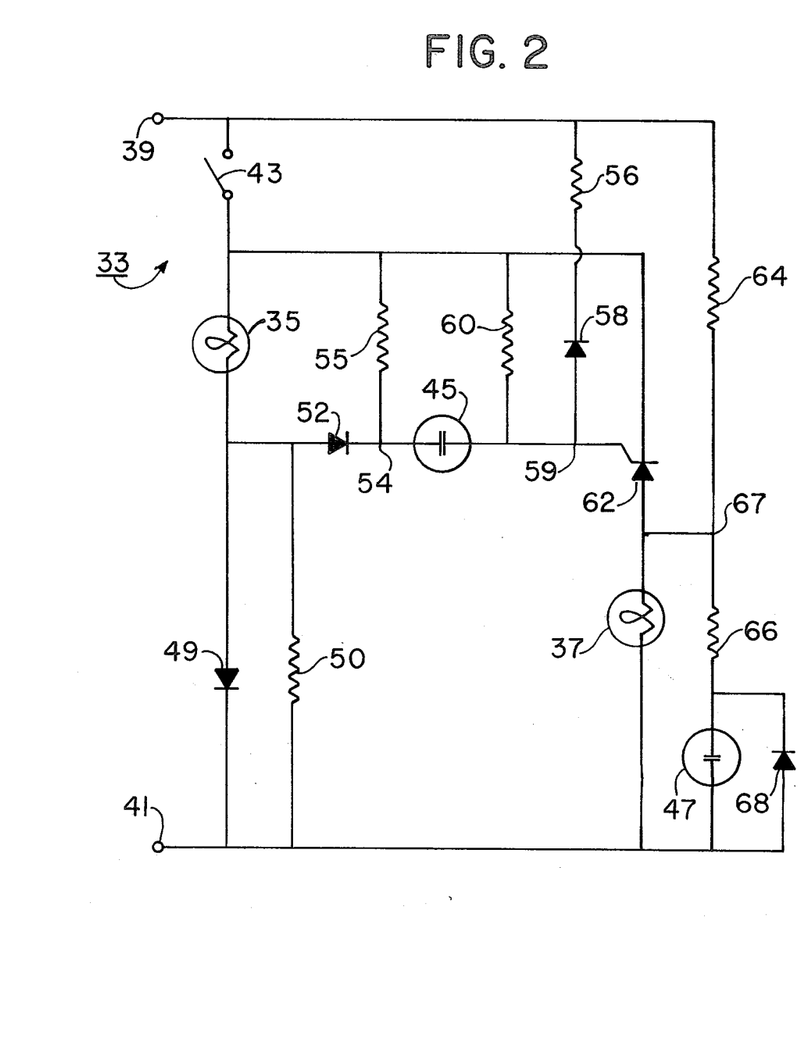
FIG. 2 is another lamp failure detection apparatus, which is constructed in accordance with the present invention and which is similar to the apparatus of FIG. 1 with the addition of a standby lamp circuit arrangement.

Referring now to FIG. 2 of the drawings, there is shown a standby lamp circuit 33, which is constructed in accordance with the present invention and which includes a primary lamp 35 and a similar standby lamp 37 switched into operation immediately upon failure of the primary lamp 35 as hereinafter described in greater detail. The circuit 33 is similar to the circuit 10 except that the circuit 33 additionally includes the standby lamp 37 and circuits for controlling it.

The circuit 33 generally comprises a switch 43, which when closed, causes the illumination of the primary lamp 35 in a similar manner that the switch 18 causes the illumination of the lamp 12 of the circuit 10. A failure-indicating neon lamp 45 becomes illuminated upon failure of the lamp 35 in a similar manner as the neon lamp 20 provides an attention-attracting signal upon the failure of the lamp 12 of the circuit 10. Similarly, a failure-indicating lamp 47 becomes illuminated when the lamp 37 becomes in operative due to an open-circuited faulty condition in a manner similar to the operation of the circuit 10. In operation, when the switch 43 is closed, the lamp 35 is illuminated by the positive half cycles of the input power in a manner similar to the illumination of the lamp 12 of the circuit 10. The lamp 35 is tested during negative half cycles of the input power and the lamp 37 is tested during positive half cycles, both during the opened and closed condition of the switch 43 as hereinafter described in greater detail. Thus, when the switch 43 is closed to illuminate the lamp 35, either one of the failure-indicating lamps 45 and 47 may become illuminated as a result of a faulty condition of either one of the lamps 35 and 37. The failure-indicating lamps 45 and 47 may also become illuminated when the switch 43 is in its open condition, since both of the lamps 35 and 37 are tested even when the switch 43 is open and the lamps 35 and 37 are extinguished.

Considering now the circuit 33 in greater detail with reference to FIG. 2 of the drawings, a diode 49 is connected between the lamp 35 and the common terminal 41 and is suitably poled so as to permit positive current flow to be extended from the main terminal 39 through the closed switch 43, the lamp 35, the diode 49 and the common terminal 41. Thus, the diode 49 serves the same purpose as the diode 22 of the circuit 10 to interrupt the electrical energy flowing through the lamp 35 during negative half cycles of the input power source to provide for a testing interval of time. A resistor 50 is connected in parallel with the diode 49 and serves as a current-limiting resistor to enable current to flow during the negative half cycles of the input power from the common terminal 41 through the resistor 50, the lamp 35, the closed switch 43 and the main terminal 39. The current flowing through the lamp 35 during the negative half cycles of the input power serves as a continuity-testing signal in a similar manner as the circuit 10 and is limited by the resistor 50 to be insufficient to illuminate the incandescent lamp 35. A diode 52 is connected between a junction 53 between the lamp 35 and the diode 49 and a junction 54 between the lamp 45 and a resistor 55, the diode 52 being suitably poled to permit the negative half cycles of the input power to cause the lamp 45 to be illuminated when a faulty condition of the lamp 35 occurs to render it effectively open-circuited. In order to provide for continuity testing current for the primary lamp 35, a resistor 56 is connected between the main terminal 39 and a suitably poled diode 58, which in turn is connected to a junction 59 between the lamp 45 and a resistor 60 connected to the switch 43. In this regard, for testing the lamp 35 during the negative half cycles of the input power, current flows from the common terminal 41 through the resistor 50, the lamp 35, to the main terminal 39 via the switch 43. If the switch 43 is open, the alternate path to the main terminal 39 is via the resistor 60, diode 58, and resistor 56. Should the lamp 35 become effectively open-circuited, line potential is applied across the neon lamp 45 to cause it to become illuminated for indicating a lamp failure condition and causing a silicon controlled rectifier 62 to become rendered conductive, the gate of the silicon controlled rectifier 62 being connected to the junction 59, its anode being connected to the lamp 37 and its cathode being connected to the switch 43. As a result, once a faulty condition occurs for the lamp 35, the failure-indicating lamp 45 is rendered illuminating and the standby lamp 37 is turned on as a result of the silicon controlled rectifier becoming conductive. The lamp 37 is energized by a path across the input terminals 39 and 41, the path including the silicon controlled rectifier 62, the lamp 37 and the closed switch 43.

A resistor 64 is connected between the main terminal 39 and one end of a resistor 66, which in turn is connected to the lamp 47, a junction 67 between the resistors 64 and 66 is connected between the silicon controlled rectifier 62 and the lamp 37, a diode 68 being connected in parallel with the failure-indicating lamp 47. As a result, when the switch 43 is either opened or closed during positive half cycles of the input power, a small continuity testing current flows from the main terminal 39 through resistor 64, through the lamp 37 to the common terminal 41. The test current flowing through the lamp 37 is insufficient to cause it to become illuminated. However, should the lamp 37 become effectively open-circuited, the line potential across the lamp 47 causes it to become illuminated by means of a current path including the input terminals 39 and 41, the lamp 47 and the resistors 64 and 66. It should be noted that when the lamp 37 is open, the lamp 47 is energized whether or not the switch 43 is closed.

When the lamp 35 fails while being energized with the switch 43 closed, the failure signal lamp 45 becomes illuminated and the standby lamp 37 illuminated to provide continuous illumination as a fail-safe arrangement. Thereafter, the lamp 35 can be removed from its socket and the lamp 37 transferred from its socket to the primary socket so that it will immediately become illuminated when the switch 43 is closed. The standby lamp 37 can then be replaced. Once the faulty lamp is replaced, the neon lamp 45 is extinguished automatically.

It should be noted that the resistor 55 functions to eliminate a ringing signal at the junction 54, which ringing signal could otherwise cause partial lighting of the lamp 45. Also, the series combination of the resistor 56 and the diode 58 serves to block conduction of the silicon controlled rectifier 62 when the switch 43 is open. Such conduction would load the circuit excessively and cause a malfunction of the lamps 45 and 47.

It should now be apparent that whether the switch 43 is open or closed, the two lamps 35 and 37 are being tested continuously, and either one of the indicating lamps 45 and 47 can be energized when a faulty condition arises with either one of the lamps 35 or 37. As a result, should the lamp 47 be energized when the switch 43 is either opened or closed, such a signal indicates that the standby lamp 37 should be replaced, even though it is not illuminated and the lamp 35 is still operative. The circuit 33 may be used in residential and institutional lighting systems in locations where security and fail-safe operations are required. For example, the circuit 33 may be employed in connection with message signs, such as emergency, fire alarm, restricted area designations or the like.

The following is a list of representative values of components of the circuit 33:

| Element | Value |
| --- | --- |
| primary lamp 35 | 60 watts, 85 volts |
| standby lamp 37 | 60 watts, 85 volts |
| failure indicating lamp 45 | Ne 2H |
| failure indicating lamp 47 | Ne 2H |
| diode 49 | 200 volts, 1 amp. |
| resistor 50 | 39 K |
| diode 52 | 200 volts, 0.1 amp. |
| resistor 55 | 1.5 Meg |
| resistor 56 | 39 K |
| diode 58 | 200 volts, 0.1 amp. |
| resistor 60 | 910 |
| silicon controlled rectifier 62 | C103B |
| resistor 64 | 39 K |
| resistor 66 | 39 K |
| diode 68 | 200 volts, 0.1 amp. |

It should be noted that diode 49 should have a voltage rating of 200 volts and a current rating determined by the requirements of the lamp 35. The other diodes can be rated 200 volts at 100 MA.

Figure 3:
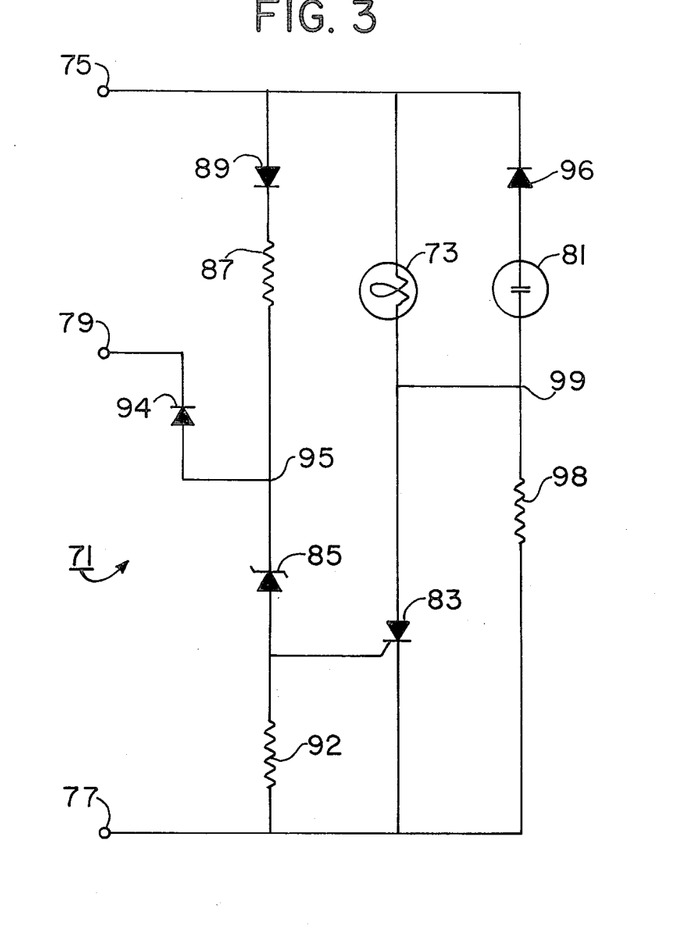
FIG. 3 is a schematic circuit diagram of still another lamp failure detection apparatus, which is also constructed in accordance with the present invention, and which employs a single lamp and is adapted to be used in connection with a digital dc input signal for controlling the energization of the lamp.

Referring now to FIG. 3 of the drawings, there is shown a simplex lamp circuit 71, which is also constructed in accordance with the present invention. The simplex lamp circuit 71 includes a lamp 73 which is energized from a source of conventional 120 V, 60 cycle power via the input terminals 75 and 77, the terminal 75 being the main terminal and the terminal 77 being the common terminal. A gate input terminal 79, when energized, switches on the lamp 73 as hereinafter described in greater detail and is energized by a low power dc gating signal such as those generated by a digital computer. In this manner, the circuit 71 is adapted to serve as a signal light for monitoring purposes in industrial control digital systems where signal light failures could be of a serious nature. In this regard, the gate input terminal 79 could be energized by either a computer system or the output of a sense amplifier (not shown) used in control systems. When controlled by a computer, a minute amount of power from the computer is required by the circuit 71. In this regard, the power for illuminating the lamp 73 is supplied via the main power source. As a result, the lamp 73 provides a very bright signal indication for control systems where greater visibility is required, and lower power requirements from the computer system are attained.

A logic level "1" of +4 volts minimum is used to switch on the lamp 73 as hereinafter described in greater detail. A logic level "0" of +0.5 volts or less supplied from the digital system (not shown) to the gate input terminal 79 causes the lamp 73 to be switched off.

Considering now the simplex lamp circuit 71 in greater detail, the circuit 71 includes a failure-indicating lamp 81 which becomes illuminated upon a faulty condition of the lamp 73. A silicon controlled rectifier 83 is switched on by a logic level "1" signal being connected to the gate input terminal 79.

A zener diode 85 is suitably poled and connected to the gate of the silicon controlled rectifier 83 and a resistor 87, which in turn is connected through a suitably poled diode 89 to the main terminal 75. A resistor 92 is connected between the common terminal 77 and the zener diode 85 to stabilize the silicon controlled rectifier 83 and to provide a triggering voltage when the zener diode 85 is rendered conductive by means of a suitably poled diode 94 connected between a junction 95 between the resistor 87 and the zener diode 85 and the gate input terminal 79. A resistor 98 is connected between the failure-indicating lamp 81 and the common terminal 77, a junction 99 between the lamp 81 and the resistor 98 is connected between the lamp 73 and the anode of the silicon controlled rectifier 83.

In operation, when a logic level "1" signal is applied to the gate input terminal 79, the silicon controlled rectifier 83 is rendered conductive to energize the lamp 73. The triggering current for the silicon controlled rectifier 83 is via a path provided during the positive half cycles of the input power source from the main terminal 75 through the diode 89, the resistor 87, the zener diode 85, the gate of the silicon controlled rectifier 83, the cathode of the silicon controlled rectifier 83, and from there to the common terminal 77. The path for lighting the lamp 73 is from the main terminal 75 through the lamp 73, the anode of the silicon controlled rectifier 83, and back to the common terminal 77. The lamp 73 is thereby illuminated. When a logic level "0" signal is applied to the gate input terminal 79, the lamp 73 is not energized. Silicon controlled rectifier 83 does not conduct because triggering current for the silicon controlled rectifier 83 is diverted through the diode 94 to the common terminal 77 via a low impedance circuit path (not shown) through the external gating circuitry (not shown) of the digital system (not shown) for controlling the circuit 71. This external circuitry is not shown because it may take any one of a variety of different forms, such as TTL, DTL, CMOS, or the like. The zener diode 85 serves to isolate the gate of the silicon controlled rectifier 83 from the voltage at the anode of the diode 94 (about 1 volt peak).

Should a faulty condition occur for the lamp 73, a large voltage appears across the lamp 73 during the negative half cycles of the input power source, thereby causing conduction through the neon lamp 81, lighting it. The conductive path for the lamp 81 is from the common terminal 77 through the resistor 98, the lamp 81, and the diode 96 to the main terminal 75.

The following is a list of representative component values for the circuit 71:

| Element | Value |
| --- | --- |
| lamp 73 | 60 watts, 85 volts |
| failure indicating lamp 81 | Ne 2H |
| silicon controlled rectifier 83 | C103B |
| zener diode 85 | 1N4372 |
| resistor 87 | 39 K |
| diode 89 | 200 volts, 0.1 amp. |
| resistor 92 | 910 |

-continued

| Element | Value |
| --- | --- |
| diode 94 | 100 volts, 0.1 amp. |
| diode 96 | 200 volts, 0.1 amp. |
| resistor 98 | 39 K |

Figure 4:
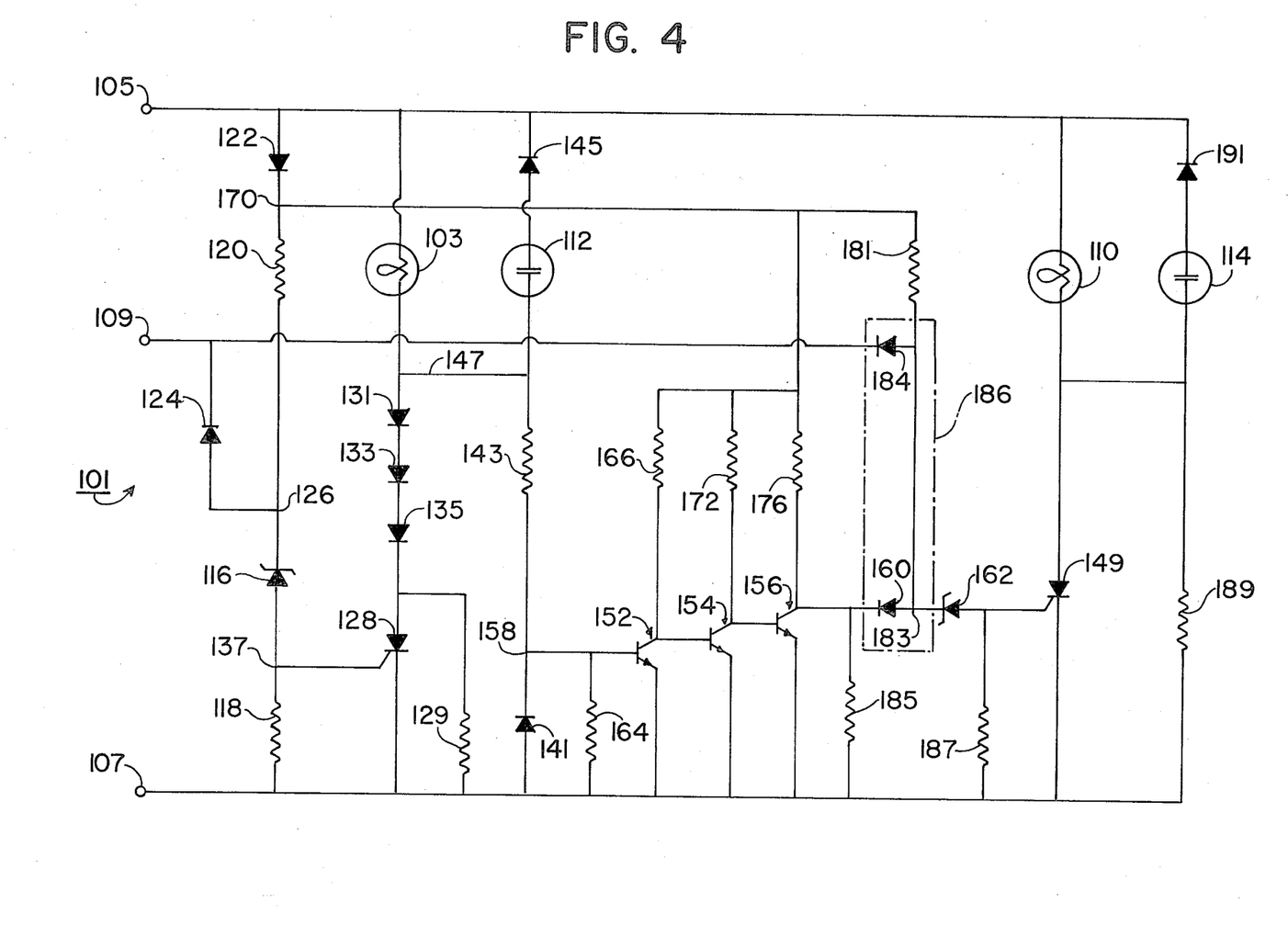
FIG. 4 is a schematic circuit diagram of yet another lamp circuit detection apparatus, which is also constructed in accordance with the present invention, and which is similar to the apparatus of FIG. 3 with the addition of a standby lamp circuit arrangement.

Referring now to FIG. 4 of the drawings, there is shown a standby light control circuit 101, which is similar to the simplex circuit 71 except that the circuit 101 is a fail-safe circuit to provide a continuous source of illumination even after a failure occurs. The circuit 101 generally comprises a primary lamp 103 which is energized by a source (not shown) of 60 cycles per second, 120 volts power connected across the input terminal 105, and 107, the terminal 105 being the ac main terminal and the terminal 107 being the common terminal. A gate input terminal 109 is adapted to be connected to a computer (not shown) in a similar manner as the terminal 79 of the circuit 71 is adapted to be connected to a source of digital output signals for controlling the turning on and off of the primary lamp 103.

A standby lamp 110 is energized automatically by the circuit 101 when the lamp 103 malfunctions due to a faulty condition by becoming open circuited, as hereinafter described in greater detail. A pair of failure indicating neon lamps 112 and 114 are illuminated when the corresponding lamps 103 and 110 malfunction in a similar manner as the neon lamp 81 of the circuit 71 becomes illuminated.

In order to provide both turn-on and turn-off control of the lamp 103, the zener diode 116 is connected through a gate drive resistor 118 to the common terminal 107 and is connected to the main termain 105 through a current limiting resistor 120 connected in series with a suitably poled diode 122 so that when a logic level "1" is supplied to the gate input terminal 109 through a suitably poled diode 124 connected to a junction 126 between the zener diode 116 and the resistor 120, whereby the zener diode 116 breaks down and causes a silicon controlled rectifier 128 to be rendered conductive, a resistor 129 being connected between the anode of the silicon controlled rectifier 128 and the common terminal 107. Once the silicon controlled rectifier 128 is thus rendered conductive, the lamp 103 is energized by the positive half cycles of the input power through a current path from the main terminal 105 through the lamp 103 and a series of three suitably poled diodes 131, 133 and 135 to the anode of the silicon controlled rectifier 128, which has its cathode connected to the common terminal 107 and its gate terminal connected to a junction 137 between the resistor 118 and the zener diode 116.

For test purposes, when a logic level "0" is supplied to the gate input terminal 109, the current required to trigger the silicon controlled rectifier 128 into conduction is entirely diverted from the silicon controlled rectifier 128 by the combined effect of the zener diode 116, the diode 124, and external gating circuitry (not shown), such that the silicon controlled rectifier 128 does not conduct, therefore lamp 103 is not energized. During negative half cycles of the input power source, current flows from the common terminal 107 through a suitably poled diode 141 and a resistor 143, the primary lamp 103 to the main terminal 105. When a malfunction occurs with the primary lamp 103, the neon lamp 112 is energized and becomes illuminated during the negative half cycles of the input power source as a result of a current path from the common terminal 107 through the diode 141 and the resistor 143, the lamp 112, and a suitably poled diode 145 to the main terminal 105. It should be noted that a common junction 147 interconnects the primary lamp 103, the neon lamp 112, the resistor 143 and the diode 131.

When the primary lamp 103 fails or is missing from its socket, a silicon controlled rectifier 149 is rendered conductive to connect the standby lamp 110 across the input terminals 105 and 107 to illuminate it. For this purpose, a series of three cascaded NPN transistors 152, 154 and 156 are connected between a junction 158 between diode 141 and resistor 143, and a diode 160, which in turn is connected to a zener diode 162 to the gate of the silicon controlled rectifier 149. Thus, when the lamp 103 fails, the neon lamp 112 is illuminated during the negative half cycles of applied power, the potential at the junction 158 causes the zener diode 162 to break down during the positive half cycles of applied power via the cascaded transistors and the diode 160, thereby rendering the silicon controlled rectifier 149 conductive for the purposes of connecting the standby lamp 110 across the input terminals 105 and 107 for energizing the lamp 110. A resistor 164 is connected between the junction 158 and the common terminal 107, and the base of the transistor 152 is connected to the junction 158. A resistor 166 is connected between the collector of the transistor 152 and a junction 170 between the resistor 120 and the diode 122. Similarly, a resistor 172 is connected between the junction 170 and the collector of the transistor 154. Also, a resistor 176 is connected similarly between the collector of the transistor 156 and the junction 170. A collector of the transistor 156 and the junction 170. A resistor 181 is connected between the junction 170 and a junction 183 between the zener diode 162 and the diode 160. A suitably poled diode 184 is connected between the junction 183 and the gate input terminal 109. The diode 184 together with the diode 160 forms a coincidence AND gate 186 for controlling the silicon controlled rectifier 149. In this regard, the silicon controlled rectifier 149 is rendered conductive when both the gate input terminal 109 is supplied with a logic level "1" and a faulty condition occurs for the lamp 103.

A resistor 185 is connected between the collector of the transistor 156 to the common terminal 107. A resistor 187 is connected between the gate of the silicon controlled rectifier 149 and the common terminal 107.

For testing the lamp 110 during the negative half cycles of the power source and signaling a malfunction of the lamp 110, a current limiting resistor 189 is connected between the neon lamp 114 and the common terminal 107, and a diode 191 is suitably poled and is connected between the other side of the lamp 114 and the main terminal 105.

In operation, the main and standby lamps are controlled by means of a computer system or other such digital system (not show) which is connected to the gate input terminal of the circuit 101. A logic level "1" signal of +4 volts minimum is supplied to the gate input terminal to cause the lamp 103 to switch on. If the lamp 103 is defective, the standby lamp 110 is energized automatically. A logic level "0" signal of +0.5 volts or less switches off the primary lamp 103 when supplied to the gate input terminal 109.

A logic level "1" signal supplied to the gate input terminal causes the silicon controlled rectifier 128 to be triggered into conduction during the positive half cycle of the applied power, thereby lighting the lamp 103. The triggering current flows through a conductive path from the main terminal 105 through the diode 122, the resistor 120, the zener diode 116, the gate of the silicon controlled rectifier 128, the cathode of the silicon controlled rectifier 128, and from there to the common terminal. The lamp 103 is energized by a path from the main terminal 105 through the lamp 103, the three cascaded diodes 131, 133 and 135, the anode-cathode circuit of the controlled rectifier 128, and from there to the common terminal 107.

With a logic level "0" signal at the gate input terminal, the silicon controlled rectifier 128 does not conduct, and therefore the primary lamp remains extinguished, because the triggering current is blocked from the gate of the silicon controlled rectifier 128 as it is diverted through the diode 124 to the common terminal 107 by a low impedance path (not shown) through the external gating circuitry (not shown) of the computer system. Such circuitry is not illustrated because it could take any variety of different forms, such as TTL, DTL, CMOS, or the like. The zener diode 116 serves to isolate the silicon controlled rectifier 128 from the voltage of the anode of the diode 124 (about 1 volt peak).

If the primary lamp 103 fails, a large voltage appears across the lamp during the negative half cycles, thereby causing conduction through the neon lamp 112 for lighting it. The conductive path includes the diode 145, the lamp 112, the resistor 143, and the diode 141.

The standby lamp 110 and the neon lamp 114 function in a similar manner, except that the control for the lamp 110 responds to the AND gate 186. The standby lamp is turned on only when two specific conditions exist at the same time. A logic level "1" signal at the gate input terminal 109 and a faulty condition of the primary lamp 103 must exist simultaneously before the AND gate 186 causes the silicon controlled rectifier 149 to be rendered conductive for energizing the lamp 110. The gate input terminal 109 is connected directly to the gate 186 at its diode 184. The cathode of the diode 160 receives a logic "0" signal if the lamp 103 is in proper working order and a logic level "1" signal if the primary lamp has failed. If the lamp 103 is in proper working condition, a voltage appears at the anode of the diode 131. The positive-going portion of this voltage is extended through the cascaded transistors 152, 154 and 156, which serve as saturated switching transistors. As a result, a logic level "0" is presented to the cathod of the diode 160 of the AND gate 186. As a result, the silicon controlled rectifier 149 and the lamp 110 remain de-energized, because the current that could trigger the silicon controlled rectifier 149 is diverted through the low impedance path offered by the diode 160 and the transistor 156, which is in saturation.

It should be noted that when the silicon controlled rectifier 128 is conducting, the forward voltage developed across the cascaded diodes 131, 133 and 135, added to the saturation voltage of the silicon controlled trectifier 128 enables the transistor 152 to operate with sufficient base drive current.

If the primary lamp is in a faulty condition, zero voltage appears at the anode of the diode 131. As a result, the cascaded transistors present a logic "1" signal to appear at the diode 160. If, at the same time, the diode 184 receives a logic "1" signal from the terminal 109, the silicon controlled rectifier 149 is energized to light the lamp 110. The path for triggering the silicon controlled rectifier 149 is through the diode 122, the resistor 181, the zener diode 162, the gate of the silicon controlled rectifier 149, and its cathode.

The following is a list of representative values of the components of the circuit 101:

| Element | Value |
| --- | --- |
| primary lamp 103 | 60 watts |
| standby lamp 110 | 60 watts |
| failure indicating lamp 112 | Ne 2H |
| failure indicating lamp 114 | Ne 2H |
| zener diode 116 | 1N4372 |
| resistor 118 | 910 |
| resistor 120 | 39 K |
| diode 122 | 200 volts, 1 amp. |
| diode 124 | 100 volts, 0.1 amp. |
| silicon controlled rectifier 128 | C103B |
| resistor 129 | 270 K |
| diode 141 | 100 volts, 0.1 amp. |
| resistor 143 | 39 K |
| diode 145 | 200 volts, 0.1 amp. |
| silicon controlled rectifier 149 | C103B |
| transistor 152 | 2N3904 |
| transistor 154 | 2N3904 |
| transistor 156 | 2N3904 |
| diode 160 | 100 volts, 0.1 amp. |
| zener diode 162 | 1N4372 |
| resistor 164 | 20 K |
| resistor 166 | 390 K |
| resistor 172 | 62 K |
| resistor 176 | 39 K |
| resistor 181 | 39 K |
| diode 184 | 100 volts, 0.1 amp. |
| resistor 185 | 4.3 K |
| resistor 187 | 910 |
| resistor 189 | 51 K |
| diode 191 | 200 volts, 0.1 amp. |
| diode 131 | 200 volts, 1 amp. |
| diode 133 | 200 volts, 1 amp. |
| diode 135 | 200 volts, 1 amp. |

Figure 5:
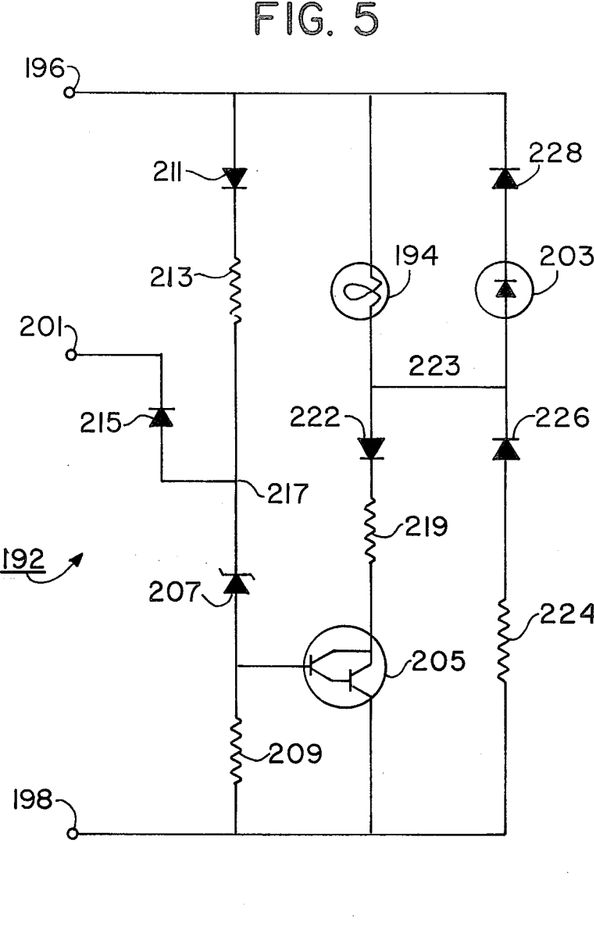
FIG. 5 is a schematic circuit diagram of an additional lamp failure detection apparatus, which is also constructed in accordance with the present invention, and which employs a single lamp adapted to be energized by a lower level ac voltage source and is controlled by a digital computer.

Referring now to FIG. 5 of the drawings, there is shown a simplex light control circuit 192. The circuit 192 is somewhat similar to the circuit of FIG. 3 but the circuit 192 generally comprises a lamp 194 which is energized by a source of 12.6 V ac power (not shown) connected to its input terminals 196 and 198, the terminal 196 being the main terminal and the terminal 198 being the common terminal. The circuit 192 is useful in industrial control systems that require low voltage signal lamps, and is powered by the power source, such as a transformer (not shown) connected to the 120 volt ac power line. The transformer is centrally located within a control system (not shown) for the purpose of supplying operating power to a plurality of signaling units (not shown), each incorporating a circuit similar to the circuit 192.

A gate input terminal 201 is adapted to be connected to a digital computer or similar system in a similar manner as the terminal 79 of the circuit 71 for turning on and off the lamp 194 in response to logic level "1" and logic level "0", respectively. A failure indicating light emitting diode 203 is illuminated upon the open circuit failure of the lamp 194 due to a faulty condition, either when the lamp 194 is illuminated or extinguished in response to the signals supplied to the gate input terminal 201. A Darlington amplifier 205 is rendered conductive in response to the logic level "1" signal supplied to the gate input terminal 201 for connecting the power to the lamp 194. In order to control the device 205, a zener diode 207 is suitably poled and is connected through a resistor 209 to the common terminal 198, the zener diode 207 being connected to the main terminal 196 through the series combination of a suitably poled diode 211 and a resistor 213. A suitably poled diode 215 is connected between the gate input terminal 201 and a junction 217 between the resistor 213 and the zener diode 207. As a result, when a logic level "1" signal is supplied to the gate input terminal 201, the zener diode 207 is rendered conductive to, in turn, cause the device 205 to become conductive for enabling the lamp 194 to be energized and thus illuminating it.

A resistor 219 is connected in series between the device 205 and a suitably poled diode 222, which in turn is connected to the lamp 194 at a junction 223.

In order to test the lamp 194 during the negative half cycles of the input power source, a resistor 224 is connected in series with a suitably poled diode 226, the combination connected between the junction 223 and the ground terminal 198. Additionally, a diode 228 is connected between the light emitting diode 203 and the main terminal 196 so that during negative half cycles of the power source, current flows from the common terminal 198 through the resistor 224, the diode 226, and the lamp 194 to the main terminal 196. The current limiting resistor 224 prevents the lamp 194 from becoming illuminated, but there is sufficient current flowing through the lamp 194 for continuity testing purposes.

The following is a list of representative component values of the circuit 192:

| Element | Value |
| --- | --- |
| lamp 194 | No. 350 |
| light emitting diode 203 | XC209R |
| Darlington amplifier 205 | TIP 110 |
| zener diode 207 | 1N4371 |
| resistor 209 | 5 K |
| diode 211 | 50 volts, 0.1 amp. |
| resistor 213 | 5 K |
| diode 215 | 50 volts, 0.1 amp. |
| resistor 219 | 7.5 |
| diode 222 | 50 volts, 1 amp. |
| resistor 224 | 470 |
| diode 226 | 50 volts, 0.1 amp. |
| diode 228 | 50 volts, 0.1 amp. |

Figure 6:
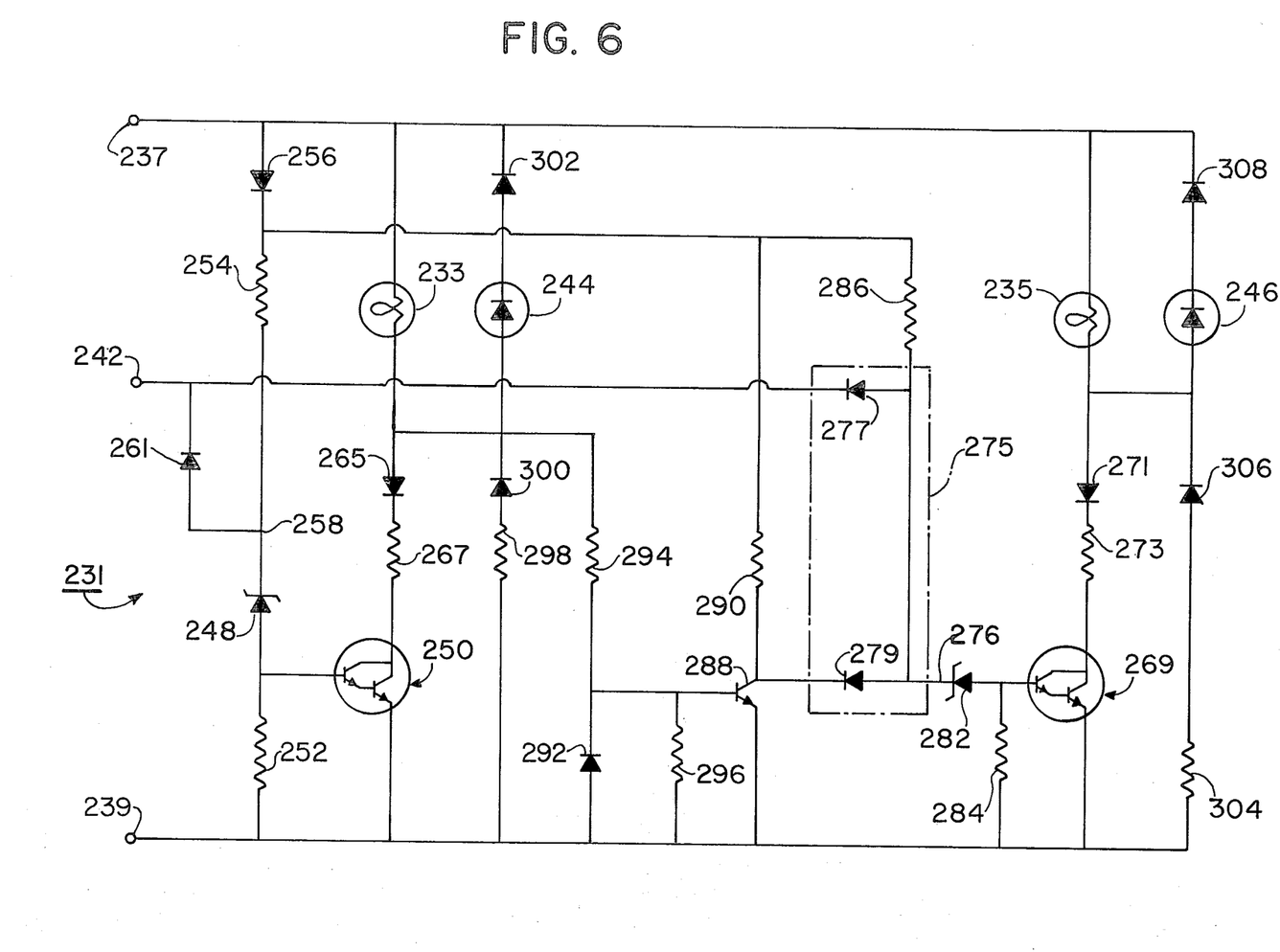
FIG. 6 is a schematic circuit diagram of a further lamp failure detection apparatus, which is also constructed in accordance with the present invention, and which is similar to the apparatus of FIG. 5 with the addition of a standby lamp circuit arrangement.

Referring now to FIG. 6 of the drawings, there is shown a fail-safe standby lamp circuit 231, which is similar to the simplex circuit 192, except that the standby lamp circuit 231 automatically continues to provide illumination following a lamp failure. The circuit 231 generally comprises a primary incandescent lamp 233 which is normally illuminated unless it fails as a result of a faulty condition, in which event a standby incandescent lamb 235 is turned on automatically by the circuit 231 as hereinafter described in greater detail. A pair of input terminals 237 and 239 are connected to a source (not shown) of 12.6 V AC, the terminal 237 being the main terminal and the terminal 239 being the common terminal. A gate input terminal 242 is adapted to be connected to a digital system in a similar manner as the gate input terminal of the simplex circuit 192. A pair of failure indicating light emitting diodes 244 and 246 become illuminated upon the failure or the absence of the corresponding lamps 233 and 235.

In order to turn on the primary lamp 233, a logic level "1" is supplied to the gate input terminal 242. A zener diode 248 becomes conductive to in turn render a Darlington amplifier 250 conductive for coupling the primary lamp 233 to the input terminals 237 and 239 for illuminating the lamp 233. When a logic level "0" is supplied to the gate input terminal 242, the amplifier 250 is rendered non-conductive to turn off the lamp 233. A biasing circuit for the amplifier 250 is connected between the common terminal 239 and the main terminal 237, the biasing circuit including the resistor 252, the zener diode 248, a resistor 254 and a suitably poled diode 256, which in turn is connected to the main terminal 237. A junction 258 between the zener diode 248 and the resistor 254 is connected through a suitably poled diode 261 to the gate input terminal 242.

When the amplifier 250 is rendered conductive, the lamp 233 is energized during the positive half cycle of the input power source through an energizing path extending from the main terminal 237, the lamp 233, the diode 265, the resistor 267, and the amplifier 250 to the common terminal 239.

In order to cause the primary lamp 233 to be illuminated in response to a logic level "1" supplied to the gate input terminal 242 to cause the amplifier 250 to be conductive, a current path during the positive half cycles of the power source is provided for energization of the lamp 233 and extends from the main terminal 237 through the lamp 233, a suitably poled diode 265, a series current limiting resistor 267, and the amplifier 250 to the common terminal 239.

In order to cause the energization of the standby lamp 235 upon a malfunction of the lamp 233, a Darlington amplifier 269 is rendered conductive to extend a current path during the positive half cycles of the power source from the main terminal 237 through the standby lamp 235, a suitably poled diode 271, a series current limiting resistor 273, and the amplifier 269 to the common terminal 239. The amplifer 269 is rendered conductive when both a logic level "1" signal is applied to the gate input terminal 242 and the lamp 233 is in a faulty condition. For this purpose, a coincidence AND gate 275 having an output junction 276 comprises a pair of suitably poled diodes 277 and 279. A zener diode 282 is suitably poled and is connected between the output junction 276 of the AND gate 275 and the base input to the amplifier 269, a biasing resistor 284 being connected between the base input to the transistor 269 and the common terminal 239. A resistor 286 is connected between the output junction 276 and the AND gate 275 and the junction between the diode 256 and the resistor 254 for biasing purposes. An NPN transistor 288 is rendered non-conductive upon the lamp 233 becoming faulty to supply a logic level "1" to the diode 279 input of the AND gate 275. The other output to the AND gate 275 is provided by a direct connection between the diode 277 and the gate input terminal 242. In this regard, the collector of the transistor 288 is connected to the diode 279 and through a biasing resistor 290 to the junction between the diode 256 and the resistor 254.

The transistor 288 remains conductive as long as the primary lamp 233 is operable. Under this condition a logic level "0" is supplied to the diode 279 via the input terminal 242 for the AND gate 275. Base drive for the transistor 288 occurs during the positive half cycle via a resistor 294 connected to the junction between the lamp 233 and the diode 265.

During the period of the negative half cycle of applied power, the lamp 233 receives a test current of a sufficiently low level so that there will not be incandescense. This current follows a conductive path between the common terminal 239 and the main terminal 237 including the parallel combination of a resistor 298, a diode 300, and a diode 292, the resistor 294 in addition to the lamp 233, a resistor 296 being connected in parallel with the diode 292. When the lamp 233 becomes open-circuited, the test current previously flowing through the lamp 233 is re-routed through the light emitting diode 244 and a diode 302. This current energizes the light emitting diode 244 to signal the failure of the lamp 233.

In order to cause the illumination of the light emitting diode 246 upon the failure of the standby lamp 235, the lamp 235 is tested during the negative half cycles of the input power source by a current path extending from the common terminal 239 through a current limiting resistor 304 and a series connected diode 306 to the main terminal 237 via the standby lamp 235. If the lamp 235 is functioning properly, the current is sufficiently low to prevent illumination thereof. However, should the lamp 235 become open-circuited or missing from its socket, the lamp test current is then diverted through the light emitting diode 246 to illuminate it for attention-attracting purposes, whereby the lamp 235 can then be replaced in a manner as described in connection with the circuit of FIG. 2. The light emitting diode 246 is turned on by means of a current flow path extending from the common terminal 239 through the resistor 304, the diode 306, the light emitting diode 246, and from there through a suitably poled diode 308 to the main terminal 237, thereby providing sufficient current during the negative half cycles of the input power source to energize the light emitting diode 246.

Considering now the operation of the circuit 231, a logic level "1" of approximately +4 volts minimum at the gate input terminal 242 causes the lamp 233 to be energized, and if the primary lamp 233 is faulty, the standby lamp 235 is energized. A logic level "0" signal of +0.5 volts or less applied to the gate input terminal 242 causes the primary lamp 233 to be switched off and thus be extinguished.

A logic "1" signal at the gate input terminal 242 causes the amplifier 250 to be rendered conductive during a positive half cycle of the applied power at the input terminal 237 and 239, thereby energizing the primary lamp 233 through a current path including the lamp 233, the diode 265, the resistor 267 and the amplifier 250. The base drive current for the amplifier 250 flows through a path from the main terminal 237, the diode 256, the resistor 254, the Zener diode 248, the base of the amplifier 250, the emitter of the amplifier 250 and from there to the common terminal 239. During the conduction of the amplifier 250, the resistor 267 limits the in-rush current through the lamp 233 to a level that is easily conducted by the amplifier 250. When a logic level "0" signal is applied at the gate input terminal 242, the amplifier 250 does not conduct and therefore the primary lamp 233 is not illuminated, since the base drive current for the amplifier 250 does not reach the base of the amplifier 250 as it is diverted through the diode 261 into the common terminal 239 via a low impedance path through gating circuitry (not shown) of the external digital control system. The Zener diode 248 isolates the base of the amplifier 250 from the voltage at the anode of the diode 261.

If the primary lamp 233 fails, the voltage appearing across it during the negative half cycle is substantially higher than normal, thereby causing conduction through the light emitting diode 244 to enable it to provide illumination and thus serve as an attention-attracting signal. When the primary lamp 233 is functioning properly, the voltage across it during the negative cycle of the input power source is too low to cause conduction through the diode 244.

The standby lamp 235 is turned on only when two specific conditions exist at the same time. In this regard, a logic level "1" signal must be present at the gate input terminal 242 and an open-circuit condition must be present at the lamp 233. When both of these conditions exist simultaneously, the amplifier 269 conducts and causes the standby lamp 235 to become illuminated when both the diodes 277 and 279 of the AND gate 275 have logic level "1" signals at their cathodes. In this regard, the cathode of the diode 279 receives a logic level "0" signal when the primary lamp 233 is in proper working condition, and a logic level "1" signal when the lamp has failed. When the lamp 233 is functioning properly, a voltage appears at the anode of the diode 265. The positive-going portion of this voltage supplies a current via the resistor 294 to the base of the transistor 288 to saturate it and thus supply a logic level "0" signal at the cathode of the diode 279 of the AND gate 275. As a result, the amplifier 269 and the standby lamp 235 remain in the off condition, because the base drive current for the amplifier 269 is diverted through the low impedance path offered by the combination of the diode 279 and the collector-emitter circuit of the transistor 288.

When the primary lamp 233 is defective or missing from its socket, a zero voltage condition appears at the anode of the diode 265 on the positive half cycle of the input power source. Thus, there is a zero base drive signal for the transistor 288, which thereby remains non-conductive and a logic level "1" signal appears at the cathode of the diode 279. If at the same time, the cathode of the diode 277 also receives a logic level "1" signal via the gate input terminal 242, the Darlington amplifier 269 is driven into conduction, thereby energizing the standby lamp 235. The conductive path for the base drive current is from the main terminal 237 through the diode 256, the resistor 286, the zener diode 282, the base and the emitter of the amplifier 269 and the common terminal 239.

The following is a list of the representative component values for the circuit 231:

| ELEMENT | VALUE |
| --- | --- |
| primary lamp 233 | No. 350 |
| standby lamp 235 | No. 350 |
| light emitting diode 244 | XC209Y |
| light emitting diode 246 | XC209R |
| Zenor diode 248 | 1N4371 |
| Darlington amplifier 250 | TIP 110 |
| resistor 252 | 5 K |
| resistor 254 | 5 K |
| diode 256 | 50 volts, 0.1 amp. |
| diode 261 | 50 volts, 0.1 amp. |
| diode 265 | 50 volts, 1 amp. |
| resistor 267 | 7.5 |
| Darlington amplifier 269 | TIP 110 |
| diode 271 | 50 volts, 1 amp. |
| resistor 273 | 7.5 |
| diode 277 | 50 volts, 0.1 amp. |
| diode 279 | 50 volts, 0.1 amp. |
| Zener diode 282 | 1N4371 |
| resistor 284 | 5 K |
| resistor 286 | 5 K |
| transistor 288 | 2N3904 |
| resistor 290 | 5 K |
| diode 292 | 50 volts, 0.1 amp. |
| resistor 294 | 5 K |
| resistor 296 | 5 K |
| resistor 298 | 470 |
| diode 300 | 50 volts, 0.1 amp. |
| diode 302 | 50 volts, 0.1 amp. |

-continued

| ELEMENT | VALUE |
| --- | --- |
| resistor 304 | 470 |
| diode 306 | 50 volts, 0.1 amp. |
| diode 308 | 50 volts, 0.1 amp. |

In each of the foregoing described circuits, both the primary and standby lamps are each conventional incandescent lamps.

What is claimed is:

1. In lamp failure detection apparatus, an arrangement adapted to be connected to a source of alternating current electrical energy and function in a dual mode such that the lamp can be lighted during the time period of one half-cycle of applied power and tested during the time period of the alternate half-cycle of applied power, said arrangement comprising: lamp means adapted to receive electrical energy during a testing interval of time; means for interrupting a circuit between the lamp means and said electrical energy source during a testing interval of time; testing means electrically connecting the lamp means and the source of electrical energy to provide a low level test signal during one half-cycle of the electrical energy to the lamp means for testing purposes without causing said lamp means to provide illumination; and means responsive to said test signal indicating a failure condition of said lamp means for generating a failure condition signal.

2. An arrangement according to claim 1, wherein said means for interrupting includes a unidirectional device, and means for bypassing said unidirectional device for enabling said lamp means to be tested during said testing interval, whereby said testing interval being one portion of a cycle of the alternating current output of the source.

3. An arrangement according to claim 1, further including switch means for coupling the source to said lamp means for causing it to be illuminated, means for bypassing said switch means for enabling said lamp means to be tested with said switch means being open and said lamp means being extinguished.

4. An arrangement according to claim 1, wherein said means for generating a failure condition signal includes a neon lamp.

5. An arrangement according to claim 1, wherein said lamp means includes a primary lamp and a standby lamp, said failure condition signal energizing said standby lamp for illuminating it in place of said primary lamp to provide a fail-safe operation.

6. An arrangement according to claim 1, wherein said means for generating a failure condition signal includes a light emitting diode.

7. An arrangement according to claim 1, further including bi-stable means for coupling said lamp means to the source.

8. An arrangement according to claim 7, wherein said bi-stable device includes a silicon controlled rectifier.

9. An arrangement according to claim 7, wherein said bi-stable device includes a Darlington amplifier.

10. An arrangement according to claim 1, wherein said lamp means includes a primary lamp and a standby lamp, bi-stable device for controlling the energization of said standby lamp, coincidence gate means responsive to said means responsive to said test signal indicating a failure condition and also responsive to a control signal turning on said primary lamp thereby causing said bi-stable device to energize said standby lamp.

11. An arrangement according to claim 10, wherein said gate means includes a pair of diodes.

* * * * *